(12) United States Patent
O'Keeffe et al.

(10) Patent No.: US 9,726,702 B2
(45) Date of Patent: Aug. 8, 2017

(54) IMPEDANCE MEASUREMENT DEVICE AND METHOD

(71) Applicant: Analog Devices, Inc., Norwood, MA (US)

(72) Inventors: Dermot O'Keeffe, Blarney (IE); Donal Bourke, Mallow (IE); David Harty, Douglas (IE); Tudor Vinereanu, Cork City (IE); Colin Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 1236 days.

(21) Appl. No.: 13/626,434

(22) Filed: Sep. 25, 2012

(65) Prior Publication Data

US 2013/0271155 A1    Oct. 17, 2013

Related U.S. Application Data

(60) Provisional application No. 61/622,633, filed on Apr. 11, 2012.

(51) Int. Cl.
| | |
|---|---|
| *G01R 31/28* | (2006.01) |
| *H03F 1/26* | (2006.01) |
| *H03B 19/00* | (2006.01) |
| *G01R 27/28* | (2006.01) |

(52) U.S. Cl.
CPC ................................. *G01R 27/28* (2013.01)

(58) Field of Classification Search
CPC ........................................................ G01R 27/28
USPC .................. 324/607, 73.1; 702/189; 327/119
See application file for complete search history.

(56) References Cited

U.S. PATENT DOCUMENTS

| | | | | |
|---|---|---|---|---|
| 2002/0141280 A1* | 10/2002 | Hamamoto | .......... | G11C 7/1051 |
| | | | | 365/233.1 |
| 2002/0169585 A1* | 11/2002 | Jones | ...................... | H04B 3/493 |
| | | | | 702/189 |
| 2007/0288183 A1* | 12/2007 | Bulkes | ............... | A61B 5/04012 |
| | | | | 702/66 |
| 2009/0274312 A1* | 11/2009 | Howard | ............... | H04R 29/003 |
| | | | | 381/58 |

* cited by examiner

*Primary Examiner* — Farhana Hoque
(74) *Attorney, Agent, or Firm* — Schwegman Lundberg & Woessner, P.A.

(57) ABSTRACT

A digital sine wave may be converted to an analog signal at a digital to analog converter (DAC). The converted analog signal may be supplied to a device and an analog return signal from the device may be passed through a relaxed anti-aliasing filter and converted to digital code words at an analog to digital converter (ADC). An impedance may be calculated from the results of a Fourier analysis of the digital code words. The ADC and DAC clock frequencies may be asynchronous, independently variable, and have a greatest common factor of 1. The clock frequencies of the ADC and/or DAC may be adjusted to change a location of images in the ADC spectrum. By using these different, adjustable clock frequencies for the ADC and the DAC, an analog signal may have increased aliasing without introducing signal errors at a frequency of interest.

28 Claims, 6 Drawing Sheets

PRIOR ART

IMPEDANCE MEASUREMENT DEVICE AND METHOD

CROSS-REFERENCE TO RELATED APPLICATIONS

This application claims priority under 35 U.S.C. §119 to provisional application No. 61/622,633, filed Apr. 11, 2012, entitled "Impedance Measurement," and the content of which is incorporated herein by reference in its entirety.

BACKGROUND

Impedance has been measured by applying an excitation signal to a device with an unknown impedance and measuring characteristics of a signal returned from the device. Specifically, a signal analyzer may "sweep" the frequencies of the return signal to calculate a magnitude and phase of the impedance. The excitation signal may be generated by converting a digital sine wave signal to an analog signal at a digital to analog converter (DAC). The analog signal may then be filtered to remove aliasing images. The filtered analog signal may then be passed through the device and the return signal may be filtered again to remove high frequency components. An analog to digital converter (ADC) may sampled the filtered return signal to generate a digital code. The digital code may be analyzed using Fourier analysis to identify individual spectral components within the digital code and calculate the impedance.

FIG. 1 shows an example of an existing impedance measuring circuit 100. In the past, the DAC 102 and ADC 105 have both used a same or equivalent clock signal 111, in that the clock signal of the DAC 102 and ADC 105 had a constant relative phase between them. This arrangement required the use of a reconstruction filter 103 and/or an anti-aliasing filter 104 that sufficiently reduced the bandwidth of the analog signal to prevent aliasing between the sampled signal and its images. Since both the DAC 102 and ADC 105 used the same clock, the filters 103 and 104 must be configured to bandlimit the analog signal in order to prevent aliasing, which may cause higher frequency waves to be represented as lower frequency waves.

If these filters 103 and 104 did not sufficiently limit the bandwidth of the analog signal, the overlap between the edges of the images will improperly increase the amplitude of the signal in the overlapping region. This will cause signal processing errors for those frequencies of interest in the overlapping region. Thus, the filters 103 and 104 must bandlimit the analog signal to prevent aliasing in those regions associated with possible frequencies of interest. This requirement may require filters 103 and 104 that are more expensive and in some case impractical for their intended use.

The inventors perceive a need to prevent increased signal processing errors for particular frequencies of interest in an aliasing region using a relaxed anti-aliasing filter.

DETAILED DESCRIPTION

In an embodiment, a digital sine wave may be converted to an analog signal at a digital to analog converter (DAC). The converted analog signal may be supplied to a device. An analog return signal from the device may be passed through a relaxed anti-aliasing filter and converted to digital code words at an analog to digital converter (ADC). The digital code words may then be analyzed at a Fourier analysis unit. An impedance may be calculated from the results of the Fourier analysis. The ADC and DAC clock frequencies may be asynchronous, independently variable, and have a greatest common factor of 1. The clock frequencies of the ADC and/or DAC may be adjusted to change a location of images in the ADC spectrum. By using these different, adjustable clock frequencies for the ADC and the DAC, it is possible to support an analog signal having increased aliasing without introducing signal errors at a frequency of interest.

Figure 1:
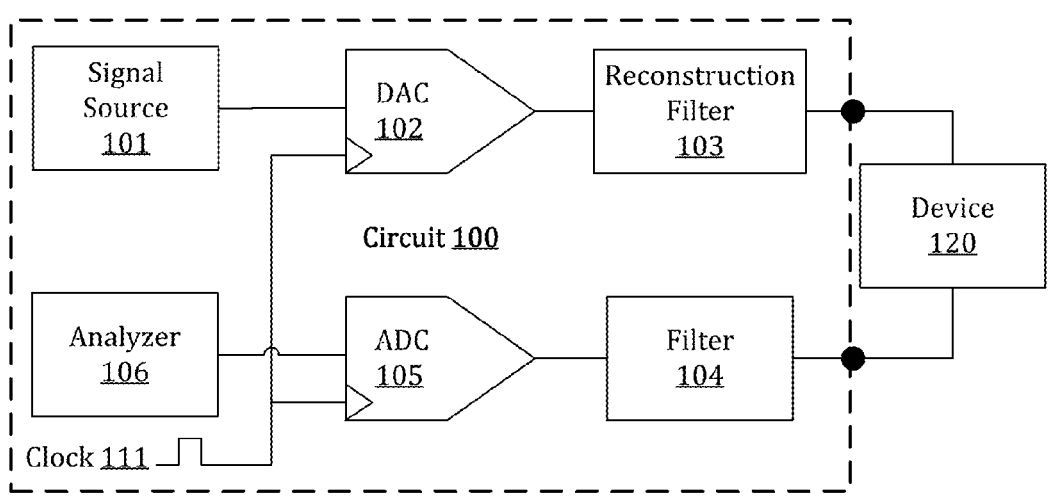
FIG. 1 shows an example of an existing impedance measuring circuit.
Figure 2:
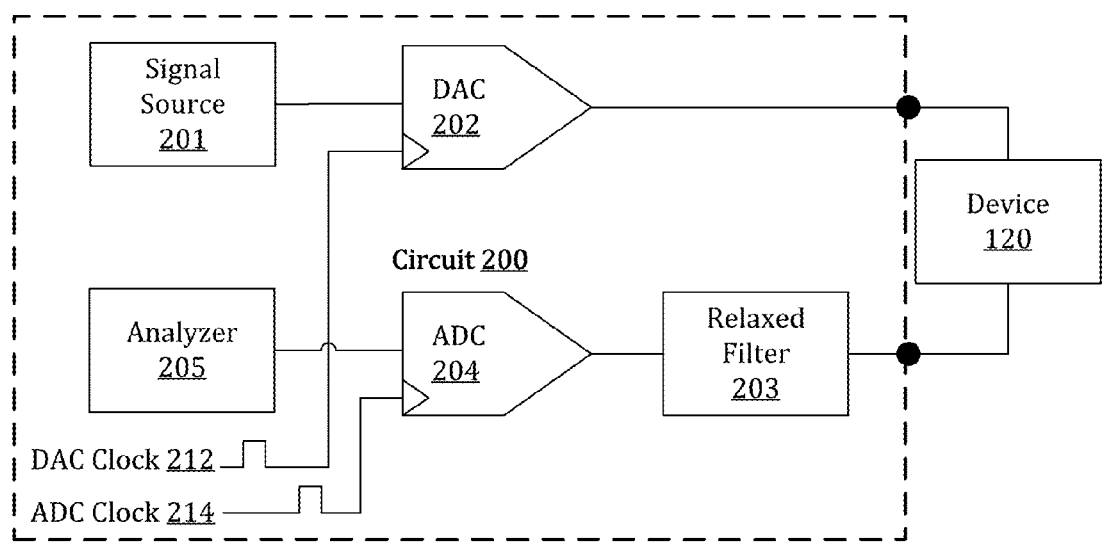
FIG. 2 shows an exemplary circuit 200 in an embodiment of the invention.

FIG. 2 shows an exemplary circuit 200 in an embodiment. A signal source 201 may supply a digital signal. The digital signal may be an oscillating signal, such as a digital sine wave signal. The signal source may be a signal generator, conductor, circuit, or other source carrying or capable of providing a digital signal to a DAC 202. In some instances, the signal source 201 may including a controller and a lookup table storing different sine values. The controller may drive the digital signal by looking up and reporting sine values listed in the table corresponding to the signal to be generated.

A DAC 202 may be coupled to the signal source 201. The DAC 202 may convert the digital code from the signal source 201 into an analog signal. The analog signal from the DAC 202 may be coupled to a device 120 through a pin or output of the circuit 200. The device 120 may include a circuit, electronics, or other components having an unknown impedance that is to be measured.

An anti-aliasing filter 203 may also be coupled to the device 120. The filter 203 may filter a return signal from the device 120. The anti-aliasing filter 203 may be a relaxed filter, in that the filter 404 may allow some overlapping or aliasing of signal images in the filtered output signal. The anti-aliasing filter 203 may be relaxed to the extent that it allows limited aliasing of signal images to the extent that the aliased sections of the images do not affect the signal amplitude at a frequency of interest, as discussed below. In some instances, the filter 203 may be configured to filter wideband interference without filtering DAC images in the return signal.

An ADC 204 may convert the filtered analog signal from the filter 203 to one or more digital code words. The ADC 204 may be configured to operate at an ADC clock frequency 214 that is asynchronous to the DAC clock frequency 212. The ADC and DAC clock frequencies 212 and 214 may be selected so that they are not integer multiples or integer divisors of each other. In this respect, the ADC and DAC clock frequencies 212 and 214 may have a greatest common factor of 1. At least one of the ADC clock frequency 214 and the DAC clock frequency 212 may be independently adjustable. These clock frequencies may be adjusted to ensure that one or more frequencies of interest are shifted away from an edge of a sampled signal that is prone to errors due to the effects of aliasing.

The ADC 405 may be coupled to an analyzer 406. The analyzer 406 may perform a Fourier analysis of the digital code words outputted by the ADC 405. An impedance of the one or more circuits, electronics, or other components of the device 403 through which the analog signal from the DAC 402 flows may also be calculated from the output of the analyzer 406.

Figure 3:
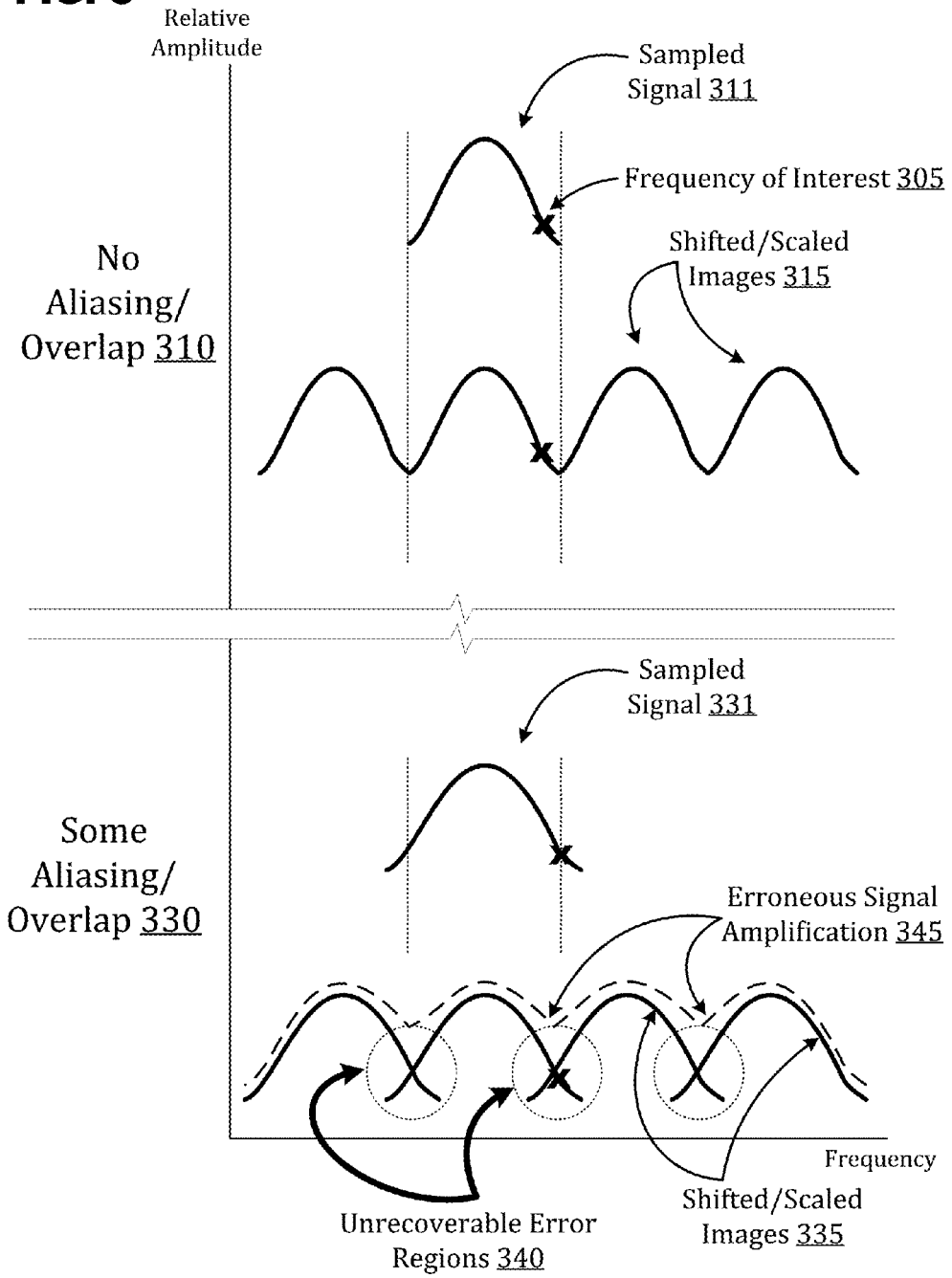
FIG. 3 shows an example of errors that may occur if a frequency of interest is near an edge of a sampled signal with synchronous DAC and ADC clock frequencies.

FIG. 3 shows an example of errors that may occur if a frequency of interest is near an edge of a sampled signal with synchronous DAC and ADC clock frequencies 111. To reconstruct a signal, several discrete samples may be taken at a rate corresponding to the synchronous clock frequency. A continuous function, such as a sinc function— sin(x)/x— may be applied to each of the sampled values. The functions may be time shifted 315 so as to correspond to the sampling time of the applied sampling value. The functions may then be added together to recover the original signal. Errors 340 may occur if there is a signal overlap 330 between the shifted and scaled functions 315 when they are added together.

The Nyquist Frequency, which is the sampling frequency divided by two, is the maximum frequency that can be digitized by a converter without any aliasing effect. When a sufficient anti-aliasing and/or reconstruction filter is used to limit the bandwidth of the sampled signal 311, the edges of the shifted and/or scaled image aliases 315 do not overlap 310. As a result, it is possible to correctly recover the amplitude at the frequency of interest 305 through low pass filtering or other techniques.

However, if the anti-aliasing filter is relaxed, some aliasing or overlapping 330 of the edges of the shifted and scaled images 335 may occur. As a result, the edges of the images 335 in the overlapping regions may add resulting in an erroneous amplification 145 (shown in the dashed line) at the overlapping edges of the resulting signal. This spectral effect cannot be filtered out and the original signal 331 may not be properly recovered in the overlapping region. Errors will occur if the frequency of interest 305 is in this overlapping region.

Figure 4:
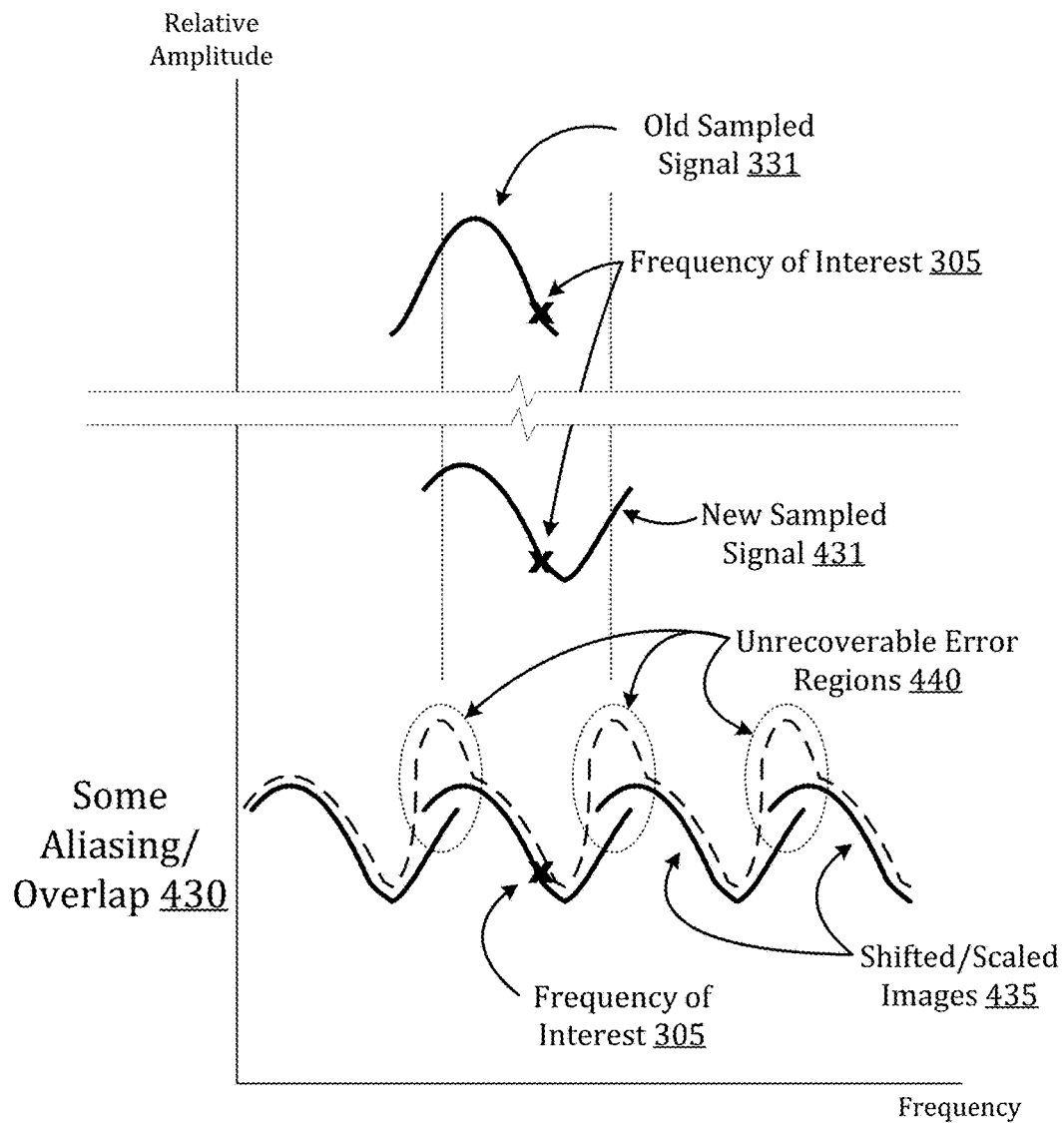
FIG. 4 shows an example of how an embodiment of the invention may be used to avoid aliasing errors around a frequency of interest.

FIG. 4 shows an example of how a sampling circuit having asynchronous DAC and ADC clock frequencies 212 and 214 may be used to avoid aliasing errors around a frequency of interest. In a sampling circuit having non-synchronous DAC and ADC clock frequencies 212 and 214, the signal sampled by the DAC 202 may vary from that sampled by the ADC 204.

Thus, instead of the ADC sampling signal 131, the ADC may sample signal 431 instead. The signal 431 to be sampled by the ADC may be selected so that the frequency of interest 305 is aligned closer to the midpoint of the sampling range instead of an edge of the sampling range as shown in sampled signal 331. When the anti-aliasing filter is relaxed, the aliasing from the overlapping edges of the shifted and scaled images 435 may add, resulting in an erroneous amplification 440 of the resulting signal (shown in the dashed line) in the aliasing regions.

This spectral effect cannot be filtered out and the original signal 431 may not be properly recovered in the overlapping region 440. However, since the clock frequency of the ADC has been selected so that frequency of interest 305 in the sampled signal 431 is centrally positioned away from the signal edges, the frequency of interest 305 will not be in an unrecoverable error region 440 resulting from the aliasing.

Thus, the amplitude at the frequency of interest will be correctly represented in the output, even though other sections of the output signal, such as unrecoverable error regions 440, may not be represented accurately.

Figure 5:
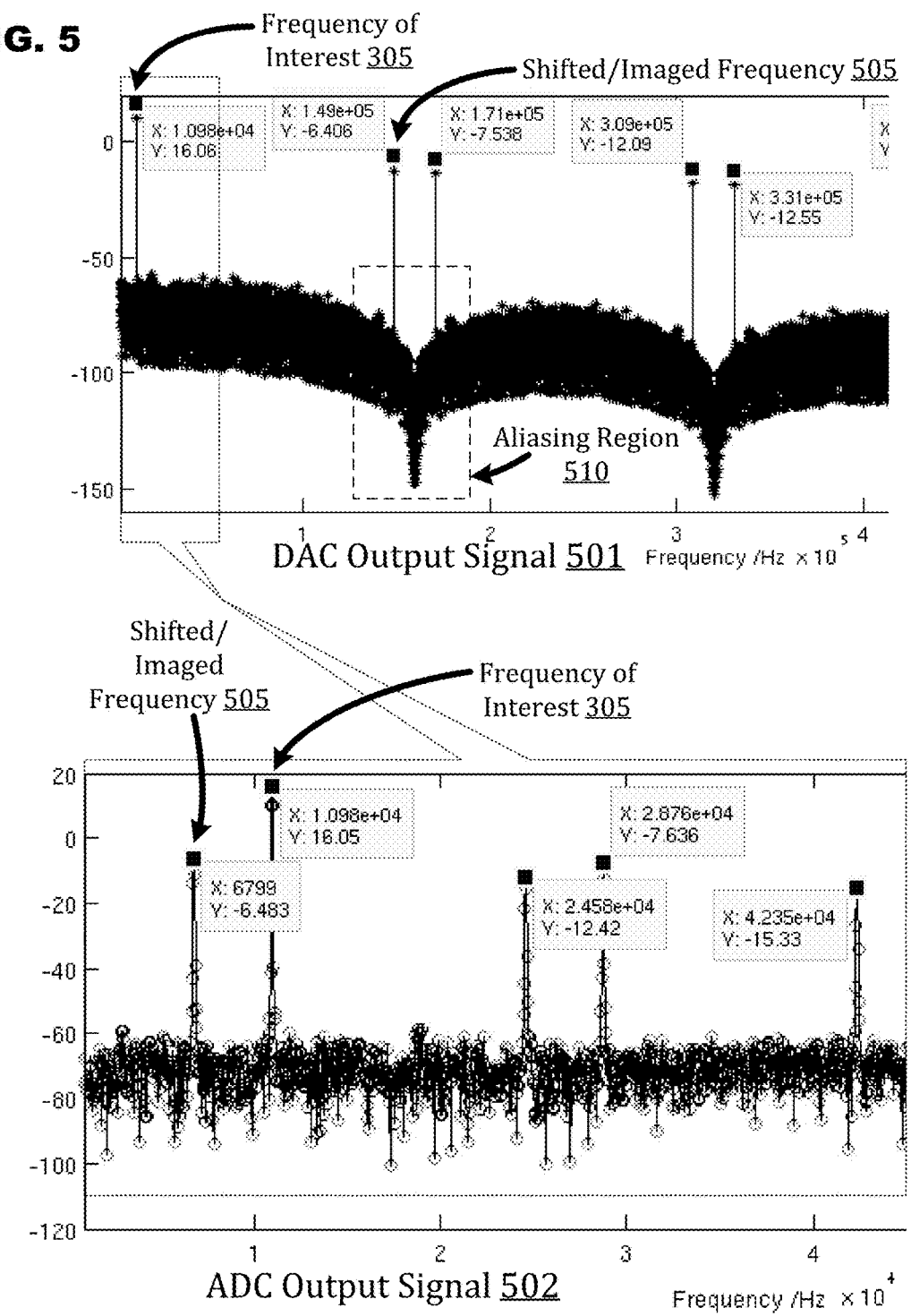
FIG. 5 shows exemplary converter outputs in an embodiment of the invention.

FIG. 5 shows exemplary converter outputs from a sampling circuit having asynchronous DAC and ADC clock frequencies 212 and 214. The DAC output signal graph 501 shows exemplary sampled output from DAC 202 at frequencies from 0 to 400 kHz. In this example, the frequency of interest 105 is about 10 kHz. A scaled and shifted image 505 of the frequency of interest 105 is shown at about 150 kHz.

This shifted image 505 may be located in or near an aliasing region 510. An ADC that processes this analog signal using a relaxed aliasing filter at an equivalent clock frequency and phase to the DAC 202 may erroneously calculate the signal amplitude in the aliasing region 310 as shown, for example, in graphs 330 and 430 in FIGS. 3 and 4.

However, an ADC having an asynchronous clock frequency to that of the DAC may shift the imaged frequency 505 away from an aliasing region so that the imaged frequency 505 is not erroneously quantified due to overlapping alias edges. The ADC output signal 502 shown in FIG. 5 is generated from an ADC that has an asynchronous clock frequency to that of the DAC. The clock frequency of the ADC may be selected so that the imaged frequency of interest 505 no longer appears in an aliasing region and will not erroneously be quantified due to overlapping alias edges.

The ADC output signal graph 502 shows exemplary sampled output from ADC clock frequencies that are not coherent to the DAC clock frequencies, As exemplified by graph 502 DAC images are aliased down to lower frequencies but are outside the band of interest for the application. The ADC output signal graph 502 shows the spectrum from 0 to one-half the sampling frequency (Fs/2) that is mirrored around Fs/2 to extend from 0 to Fs. This spectrum from 0 to Fs, including the mirrored component is then repeated at every sampling frequency interval (e.g. every Fs). If the ADC and DAC sampling frequencies are integer multiples of each other, then the nth image of the DAC will alias into the wanted signal. However, if they are non-integer multiples of each other, the DAC image may alias into another portion of the ADC spectrum.

Figure 6:
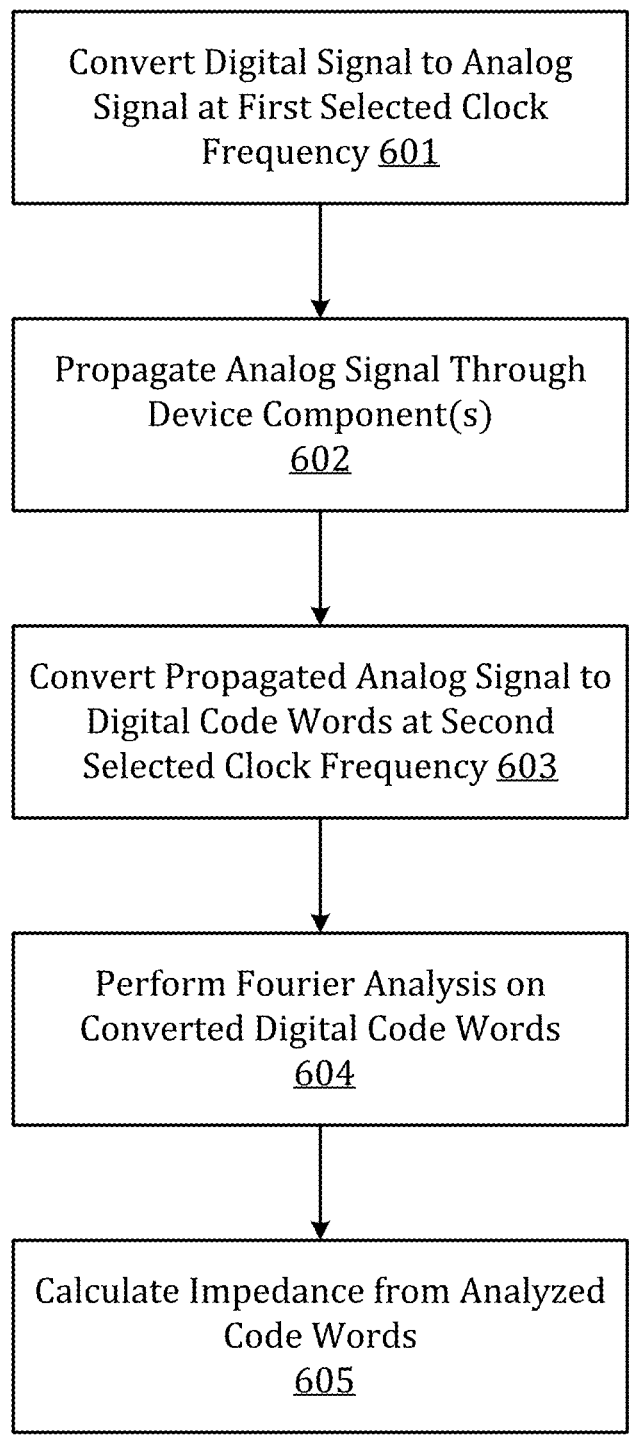
FIG. 6 shows an exemplary method in an embodiment of the invention.

FIG. 6 shows an exemplary process in an embodiment of the invention. In box 601, a digital signal, which may include an oscillating signal, such as a sine wave, may be converted to an analog signal at a first clock frequency.

In box 602, the converted analog signal may be propagated through one or more circuits, electronics, and/or other components of a device to be measured.

In box 603, a return signal from the device may be converted back to digital code words at a second clock frequency. In some instances, the propagated analog signal may be first filtered through an anti-aliasing filter, which may remove some, but not all overlapping or aliasing of images in the analog signal. The first and second clock frequencies may be asynchronous. The second clock frequency and the first clock frequency need not be integer multiples or divisors of the other, and may have a greatest common factor of 1. In some instances, the first and/or second clock frequencies may be adjusted in order to change the location of images in the ADC spectrum based on expected locations of aliasing regions or other device specific considerations.

In box 604, a Fourier analysis may be performed on the converted digital code words in box 603. The Fourier analysis may decompose the function represented by the digital code words into simpler functions.

In box 605, the results of the Fourier analysis may be used to calculate an impedance of the one or more circuits, electronics, and/or other components of the device through which the analog signal was propagated.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, in different embodiments the analyzer may be provided in a separate circuit from the DAC and ADC.

We claim:

1. An impedance measuring circuit in which clock frequencies are adjusted to reduce signal errors at a frequency of interest, the circuit comprising:
   a signal source;
   a digital to analog converter (DAC) coupled to the signal source and an output of the circuit to perform a digital to analog conversion with a sample rate at a first clock frequency;
   an analog to digital converter (ADC) coupled to an input of the circuit to perform an analog to digital conversion with a sample rate at a second clock frequency, wherein one or both of the first clock frequency and the second clock frequency are independently adjustable to clock frequencies that reduce the signal errors at the frequency of interest of an analog input signal due to signal sampling; and
   an analyzer coupled to the ADC and configured to calculate, using an output of the ADC, impedance of a device coupled between the input and the output of the circuit.

2. The circuit of claim 1, further comprising a filter coupled between the ADC and the input of the circuit.

3. The circuit of claim 2, wherein the filter is a relaxed anti-aliasing filter that allows some overlapping or aliasing of signal images in a filtered output signal.

4. The circuit of claim 3, wherein the relaxed anti-aliasing filter allows aliasing to an extent that that aliased sections of the signal images do not affect a signal amplitude at a frequency of interest.

5. The circuit of claim 2, wherein the filter is a wideband interference filter that does not filter images outputted by the DAC as they appear in a return signal at the input of the circuit after passing through the device.

6. The circuit of claim 1, wherein the second clock frequency of the ADC is asynchronous to the first clock frequency of the DAC.

7. The circuit of claim 1, wherein the second clock frequency of the ADC is adjustable and selected to have a greatest common factor of one with the first clock frequency of the DAC, the first clock frequency of the DAC being a predetermined clock frequency.

8. The circuit of claim 1, wherein the first clock frequency of the DAC is adjustable and selected to have a greatest common factor of one with the second clock frequency of the ADC, the second clock frequency of the ADC being a predetermined clock frequency.

9. The circuit of claim 1, wherein the second clock frequency of the ADC and the first clock frequency of the DAC are both adjustable and selected to have a greatest common factor of one.

10. The circuit of claim 9, wherein the first and second clock frequencies are selected to ensure that one or more frequencies of interest are shifted away from an edge of a sampled signal prone to errors due to aliasing.

11. The circuit of claim 1, wherein the analyzer performs a Fourier analysis of a digital signal outputted by the ADC.

12. The circuit of claim 11, wherein the analyzer calculates impedance of the device from the Fourier analysis.

13. A method of operating a circuit to measure an impedance of a device connected to the circuit, the method comprising;
   converting a digital signal source to an analog signal using a first sample rate at a first clock frequency;
   propagating the analog signal from an output of the circuit through the device;
   converting a return signal received at an input of the circuit from the device into a second digital signal using a second sample rate at a second clock frequency;
   adjusting one of the first and second clock frequencies relative to the other of the first and second clock frequencies to reduce signal errors at a frequency of interest of the return signal due to sampling of the return signal; and
   calculating the impedance of the device using the second digital signal.

14. The method of claim 13, further comprising selecting the first clock frequency to shift at least one frequency of interest away from an edge of a sampled signal prone to errors due to aliasing.

15. The method of claim 13, further comprising selecting the second clock frequency to shift at least one frequency of interest away from an edge of a sampled signal prone to errors due to aliasing.

16. The method of claim 13, further comprising selecting the first and second clock frequencies to shift at least one frequency of interest away from an edge of a sampled signal prone to errors due to aliasing.

17. The method of claim 13, further comprising filtering the return signal before the conversion into the second digital signal.

18. The method of claim 17, wherein the filtering is relaxed anti-aliasing filtering that allows some overlapping or aliasing of signal images in a filtered output signal.

19. The method of claim 18, wherein the relaxed anti-aliasing filtering allows aliasing to an extent that that aliased sections of the signal images do not affect a signal amplitude at a frequency of interest.

20. The method of claim 17, wherein the filtering is wideband interference filtering that does not filter images in the analog signal as they appear in the return signal after the analog signal passes through the device.

21. The method of claim 13, wherein the calculating the impedance includes performing a Fourier analysis of the second digital signal and calculating the impedance from a result of the Fourier analysis.

22. An impedance measuring circuit in which clock frequencies are adjusted to reduce signal error at a frequency of interest, the circuit comprising:
   a digital to analog converter (DAC) to receive a signal source and output an analog signal from the measuring circuit to a device; and
   an analog to digital converter (ADC) coupled to an input of the measuring circuit to convert a return signal from the device into a digital signal, the DAC and ADC each operating at a different respective first and second sample rate at a different respective first and second different clock frequency, wherein one or both of the first and the second clock frequencies are adjustable to clock frequency values that reduce the signal error at the frequency of interest of the return signal due to signal sampling; and an analyzer to calculate an impedance of the device as a function of the digital signal.

23. The impedance measuring circuit of claim 22, further comprising a filter coupled between the device and the ADC.

24. An impedance measuring circuit, comprising:

means for converting a first digital signal source to a first analog signal, the means for converting coupled to the first digital signal source and an output of the impedance measuring circuit and configured to operate with a sample rate at a first clock frequency;

means for converting a second analog signal to a second digital signal, the means for converting coupled to an input of the impedance measuring circuit and configured to operate with a sample rate at a second clock frequency, wherein one or both of the first clock frequency and the second clock frequency are independently adjustable to clock frequencies that reduce the signal errors at the frequency of interest of an analog input signal due to signal sampling; and means for calculating an impedance of a device coupled between the input and the output of the impedance measuring circuit using the second digital signal.

25. The impedance measuring circuit of claim 24, further comprising means for filtering a signal at the input of the impedance measuring circuit to produce the second analog signal.

26. The impedance measuring circuit of claim 24, wherein the second clock frequency is asynchronous to the first clock frequency.

27. The impedance measuring circuit of claim 24, further comprising means for adjusting at least one of the first or second clock frequencies to have a greatest common factor of one with the other of the first or second clock frequencies.

28. The impedance measuring circuit of claim 24, wherein the means for calculating performs a Fourier analysis of the second digital signal.

* * * * *